(12) United States Patent
Chien

(10) Patent No.: US 10,802,305 B2
(45) Date of Patent: Oct. 13, 2020

(54) CONVEYING APPARATUS AND MANUFACTURING SYSTEM OF DISPLAY PANEL

(71) Applicants: HKC Corporation Limited, Shenzhen (CN); Chongqing HKC Optoelectronics Technology Co., Ltd., Chongqing (CN)

(72) Inventor: Chung-Kuang Chien, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/346,119

(22) PCT Filed: May 5, 2017

(86) PCT No.: PCT/CN2017/083219
§ 371 (c)(1),
(2) Date: Apr. 30, 2019

(87) PCT Pub. No.: WO2018/107647
PCT Pub. Date: Jun. 21, 2018

(65) Prior Publication Data
US 2019/0258095 A1    Aug. 22, 2019

(30) Foreign Application Priority Data

Dec. 13, 2016   (CN) .......................... 2016 1 1144306

(51) Int. Cl.
| | | |
|---|---|---|
| B65G 47/90 | (2006.01) | |
| B65G 47/74 | (2006.01) | |
| B65G 47/00 | (2006.01) | |
| G02F 1/13 | (2006.01) | |
| B65G 47/91 | (2006.01) | |
| B65G 49/06 | (2006.01) | |
| G02F 1/1333 | (2006.01) | |
| H01L 21/687 | (2006.01) | |
| H01L 21/677 | (2006.01) | |

(52) U.S. Cl.
CPC ......... *G02F 1/1303* (2013.01); *B65G 47/902* (2013.01); *B65G 47/91* (2013.01); *B65G 47/914* (2013.01); *B65G 49/061* (2013.01); *G02F 1/1333* (2013.01); *H01L 21/67706* (2013.01); *H01L 21/687* (2013.01); *H01L 21/68707* (2013.01)

(58) Field of Classification Search
None
See application file for complete search history.

(56) References Cited

U.S. PATENT DOCUMENTS

| | | | | |
|---|---|---|---|---|
| 2012/0037481 | A1* | 2/2012 | He | B65G 49/064 198/890.1 |
| 2013/0078371 | A1* | 3/2013 | Chang | B65H 23/26 427/177 |
| 2015/0117990 | A1* | 4/2015 | Lu | B23Q 7/04 414/226.05 |

* cited by examiner

*Primary Examiner* — Kavel Singh (57) ABSTRACT

The present application discloses a conveying apparatus and a manufacturing system of a display panel. The conveying apparatus includes a fixing bracket and a load-bearing platform adapted to convey the display panel, where the fixing bracket and the load-bearing platform are fixedly connected through a rotation axis, a clamping piece is disposed on the load-bearing platform, and the clamping piece is adapted to clamp and fix the display panel.

20 Claims, 10 Drawing Sheets

CONVEYING APPARATUS AND MANUFACTURING SYSTEM OF DISPLAY PANEL

The present application claims priority to the Chinese Patent Application No. CN201611144306X, filed to the Chinese Patent Office on Dec. 13, 2016 and entitled "CONVEYING APPARATUS AND MANUFACTURING SYSTEM OF DISPLAY PANEL", which is incorporated herein by reference in its entirety.

TECHNICAL FIELD

The present application relates to the technical field of displays, and more particularly to a conveying apparatus and a manufacturing system of a display panel.

BACKGROUND

The statements herein merely provide background information related to the present application and do not necessarily constitute prior art.

Liquid crystal display apparatuses have numerous advantages, such as a thin body, power savings, no radiation, and are widely used. Most liquid crystal display apparatuses in a current market are backlit type liquid crystal display apparatuses, each including a liquid crystal panel and a backlight module. Working principle of the liquid crystal panel is that liquid crystals are put in two parallel glass substrates, and a driving voltage is applied to two glass substrates to control rotation of the liquid crystals, to refract light rays of the backlight module to generate a picture.

Thin film transistor-liquid crystal display apparatuses (TFT-LCD apparatuses) currently maintain a leading status in the display field because of low power consumption, excellent picture quality, high production yield, and other properties. Similarly, the thin film transistor-liquid crystal display apparatus includes a liquid crystal panel and a backlight module. The liquid crystal panel includes a color filter substrate (CF substrate), a thin film transistor substrate (TFT substrate) and a mask, and transparent electrodes on respective inner sides of the above substrates. A layer of liquid crystals (LC) is positioned between two substrates.

Because display panels comply with trends of generations, the display panels have a demand tendency of large sizes and thinning. However, in a manufacturing process of the panels, the panels are required to be transferred to complete tasks of different procedures. A probability of damage in a process of moving the panels is increased. Especially, large and thin products have a higher breaking risk.

SUMMARY

The present application provides a conveying apparatus and a manufacturing system of a display panel for reducing a breaking risk and shortening taste time.

A purpose of the present application is realized by the following technical solution. A conveying apparatus of a display panel, including a fixing bracket and a load-bearing platform adapted to convey the display panel; The fixing bracket and the load-bearing platform are fixedly connected through a rotation axis. A clamping piece is disposed on the load-bearing platform and the clamping piece is adapted to clamp and fix the display panel; a hook is used as the clamping piece, and the clamping piece is disposed in an edge of the load-bearing platform; the hook is adjustable; the hook is tightly close to the display panel to clamp and fix the display panel when the hook is in a first state; the hook is separated from the display panel when the hook is in a second state; the load-bearing platform includes a load-bearing surface correspond to the display panel; a backlight module is disposed on the load-bearing platform and the backlight module is disposed on the load-bearing surface; the backlight module is detachably disposed on the load-bearing platform; the conveying apparatus further includes locations for enabling the load-bearing platform to rotate around the rotation axis, the locations are adapted to fix a position when the load-bearing platform rotates around the rotation axis by a preset angle and the fixing bracket is disposed in a retractable mode; the conveying apparatus further includes at least one sliding chute; the fixing bracket is disposed in the sliding chute, the fixing bracket and the load-bearing platform move along preset tracks of the sliding chute, the fixing bracket is also provided with at least at least one roller; and the fixing bracket and the load-bearing platform move through the roller.

A purpose of the present application is realized by the following technical solution. A conveying apparatus of a display panel includes: a fixing bracket, and a load-bearing platform adapted to convey the display panel, the fixing bracket and the load-bearing platform are fixedly connected through a rotation axis, a clamping piece is disposed on the load-bearing platform and the clamping piece is adapted to clamp and fix the display panel.

Optionally, an absorber is used as the clamping piece.

Optionally, a hook is used as the clamping piece.

Optionally, the clamping piece is disposed in an edge of the load-bearing platform.

Optionally, the hook is adjustable, the hook is tightly close to the display panel to clamp and fix the display panel when the hook is in a first state, and the hook is separated from the display panel when the hook is in a second state. Specifically, the hook is in an adjustable operating state.

Optionally, the load-bearing platform includes a load-bearing surface correspond to the display panel.

Optionally, a backlight module is disposed on the load-bearing platform.

Optionally, the backlight module is disposed on the load-bearing surface.

Optionally, the backlight module is detachably disposed on the load-bearing platform.

Optionally, the conveying apparatus further includes locations for enabling the load-bearing platform to rotate around the rotation axis, and the locations are adapted to fix a position when the load-bearing platform rotates around the rotation axis by a preset angle.

Optionally, the fixing bracket is disposed in a retractable mode.

Optionally, the conveying apparatus further includes at least one sliding chute; the fixing bracket is disposed in the sliding chute, the fixing bracket and the load-bearing platform move along preset tracks of the sliding chute.

Optionally, the fixing bracket is also provided with at least at least one roller; and the fixing bracket and the load-bearing platform move through the roller.

Optionally, the manufacturing system also includes a plane placing tray, when the display panel is taken out, it is placed horizontally on the plane placing tray.

Optionally, the manufacturing system also includes an oven, the display panel is placed into the oven in a vertical position.

The present application also discloses a manufacturing system of a display panel, including the transfer device of the display panel described above.

The load-bearing platform realizes rotation in different directions through the rotation axis, and simultaneously acts as a taste inspecting platform of the display panel, thereby solving sample breaking easily caused by placement in different axial directions when the panel is taken from the plane placing tray into a taste platform for operation and when the panel is placed onto the oven, saving more steps and time and increasing the efficiency.

BRIEF DESCRIPTION OF DRAWINGS

The drawings included are used for providing further understanding of embodiments of the present application, constitute portion of the description, are used to illustrate implementation manners of the present application and interpreted principles of the present application together with text description. Apparently, the drawings in the following description are merely some embodiments of the present application, and for those of ordinary skill in the art, other drawings can also be obtained according to the drawings without contributing creative labor. In the drawings.

DETAILED DESCRIPTION

Specific structure and function details disclosed herein are only representative and are used for the purpose of describing exemplary embodiments of the present application. However, the present application may be specifically achieved in many alternative forms and shall not be interpreted to be only limited to the embodiments described herein.

It should be understood in the description of the present application that terms such as "central", "horizontal", "upper". "lower", "left", "right", "vertical", "horizontal", "top", "bottom", "inner", "outer", etc. indicate direction or position relationships shown based on the drawings, and are only intended to facilitate the description of the present application and the simplification of the description rather than to indicate or imply that the indicated apparatus or element must have a specific direction or constructed and operated in a specific direction, and therefore, shall not be understood as a limitation to the present application. In addition, the terms such as "first" and "second" are only used for the purpose of description, rather than being understood to indicate or imply relative importance or hint the number of indicated technical features. Thus, the feature limited by "first" and "second" can explicitly or impliedly includes one or more features. In the description of the present application, the meaning of "a plurality of" is two or more unless otherwise specified. In addition, the term "include" and any variant are intended to cover non-exclusive inclusion.

It should be noted in the description of the present application that, unless otherwise specifically regulated and defined, terms such as "installation", "connected" and "connection" shall be understood in broad sense, and for example, may refer to fixed connection or detachable connection or integral connection, may refer to mechanical connection or electrical connection, and may refer to direct connection or indirect connection through an intermediate medium or inner communication of two elements. For those of ordinary skill in the art, the meanings of the above terms in the present application may be understood according to specific conditions.

The terms used herein are intended to merely describe specific embodiments, not to limit the exemplary embodiments. Unless otherwise noted clearly in the context, singular forms "one" and "single" used herein are also intended to include plurals. It should also be understood that the terms "comprise" and/or "include" used herein specify the existence of stated features, integers, steps, operation, units and/or assemblies, not excluding the existence or addition of one or more other features, integers, steps, operation, units, assemblies and/or combinations of these.

The present application will be further described in detail below in combination with the drawings and optional embodiments.

The structural schematic diagram of the conveying apparatus of the display panel of the embodiment of the present application is described below with reference to FIG. 1 to FIG. 11.

In an embodiment of the present application, FIGS. 1 to 4 and FIG. 7, show the structural schematic diagram of the conveying apparatus of the display panel of an embodiment of the present application. The conveying apparatus includes a fixing bracket 1 and a load-bearing platform 2 adapted to convey the display panel 10, where the fixing bracket 1 and the load-bearing platform 2 are fixedly connected through a rotation axis 3, a clamping piece 4 is disposed on the load-bearing platform 2 and the clamping piece 4 is adapted to clamp and fix the display panel 10. The load-bearing platform 2 realizes rotation in different directions through the rotation axis 3, and simultaneously acts as a taste inspecting platform of the display panel 10, thereby solving sample breaking easily caused by placement in different axial directions when the panel is taken from the plane placing tray 8 into a taste platform for operation and when the panel is placed onto the oven 9, saving more steps and time and increasing the efficiency. Effects are more apparent especially with respect to large thin samples.

Figure 1:
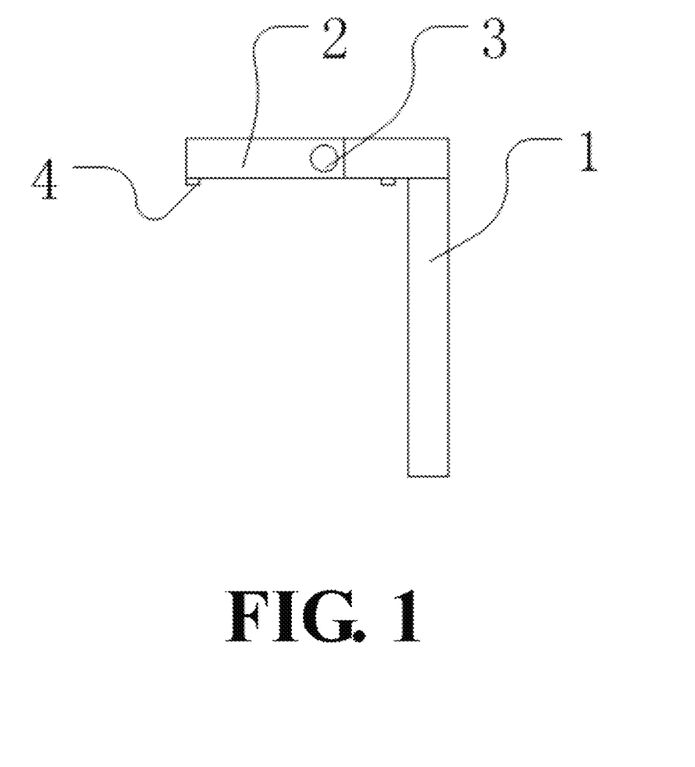
FIG. 1 is a structural schematic diagram of a conveying apparatus of a display panel of an embodiment of the present application.
Figure 2:
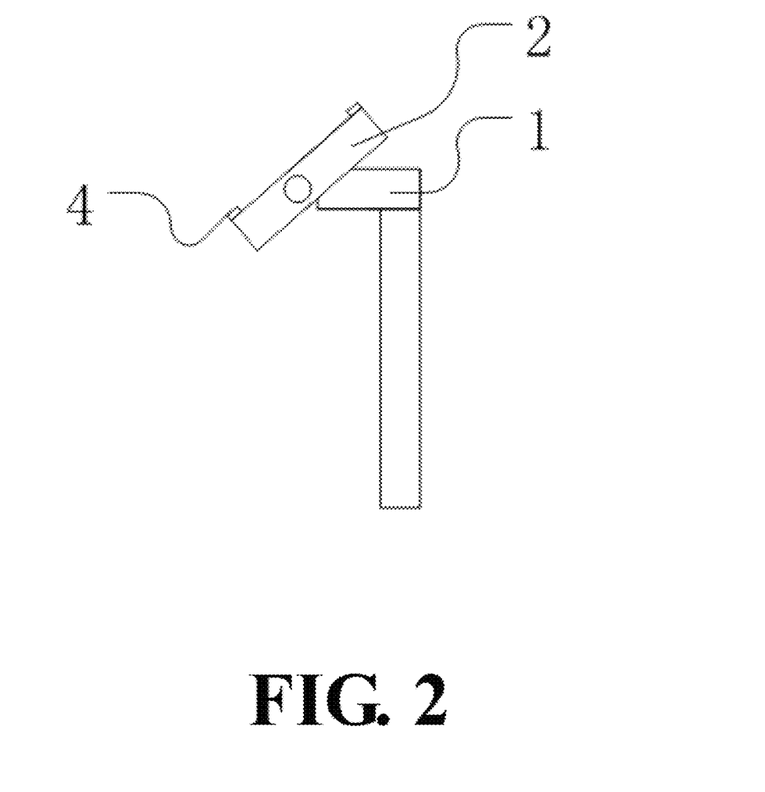
FIG. 2 is a structural schematic diagram of a conveying apparatus of a display panel of an embodiment of the present application.
Figure 3:
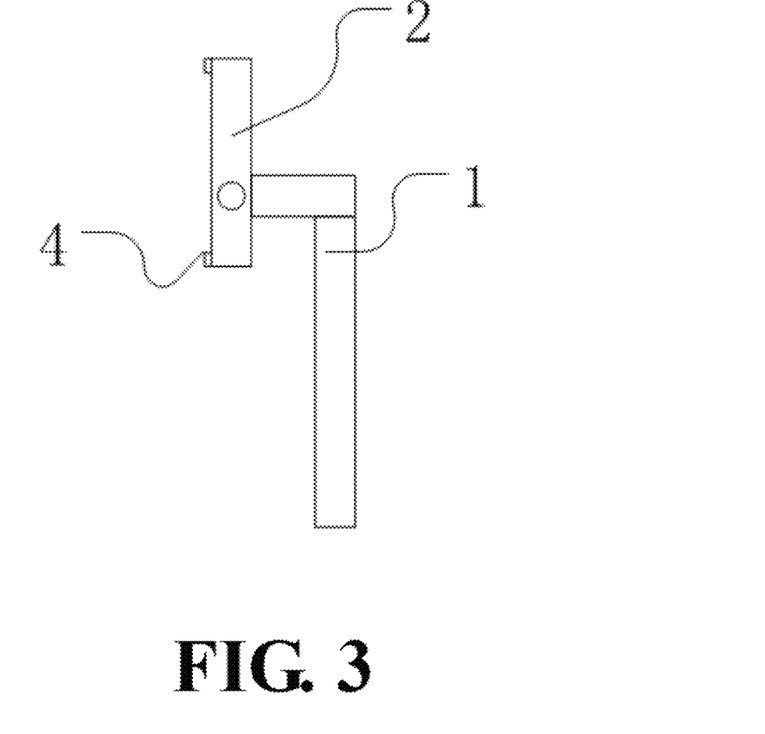
FIG. 3 is a structural schematic diagram of a conveying apparatus of a display panel of an embodiment of the present application.
Figure 4:
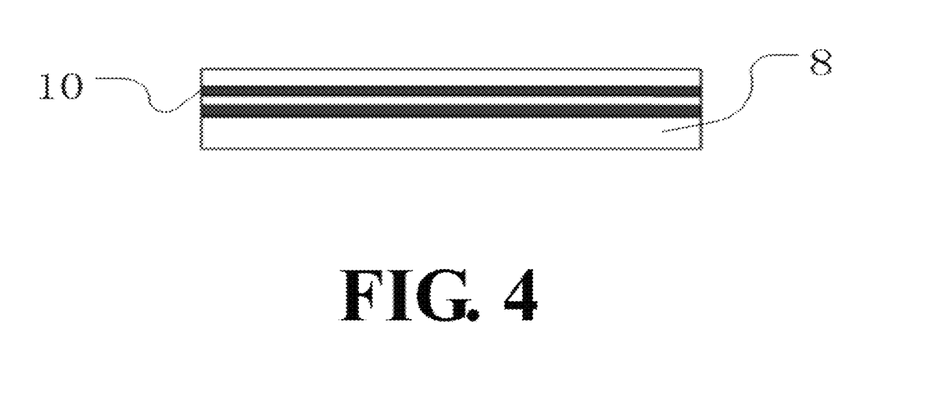
FIG. 4 is a position schematic diagram of a plane placing tray of a display panel of an embodiment of the present application.
Figure 5:
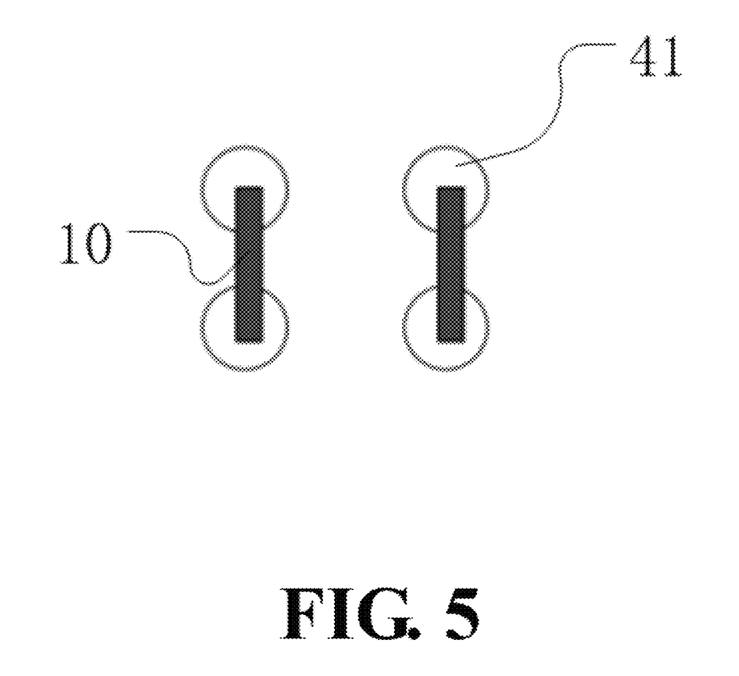
FIG. 5 is a structural schematic diagram of using an absorber in a conveying apparatus of a display panel of an embodiment of the present application.
Figure 6:
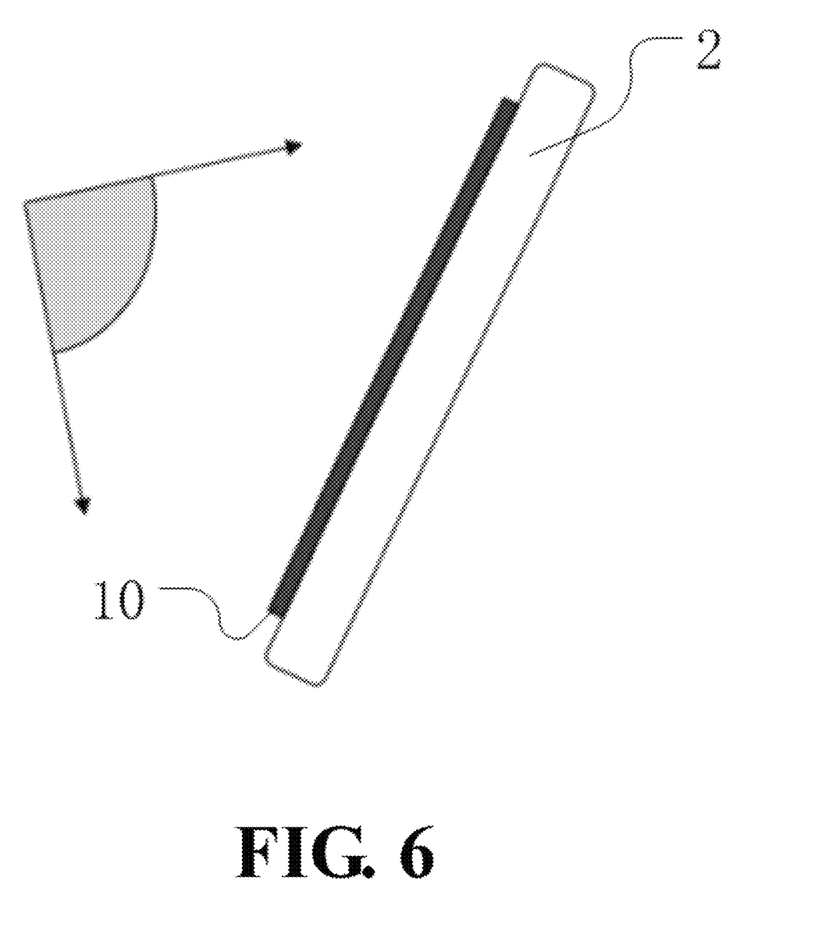
FIG. 6 is a position schematic diagram of a load-bearing platform in taste inspection for a display panel of an embodiment of the present application.
Figure 7:
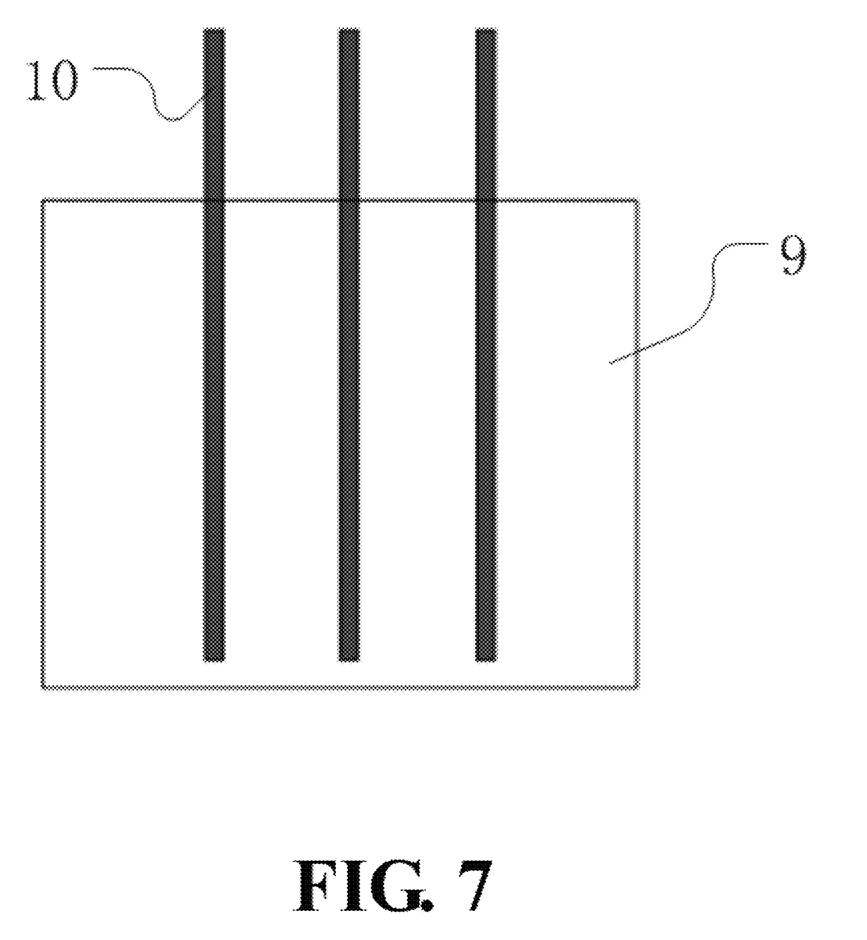
FIG. 7 is a position schematic diagram of an oven of a display panel of an embodiment of the present application.

FIGS. 1 to 3, show the structural schematic diagram of the conveying apparatus of the display panel of an embodiment of the present application. The load-bearing platform 2 is respectively in a horizontal position, an inclined position convenient for taste detection of the display panel 10, and a vertical position. Correspondingly, as shown in FIG. 4, FIG. 6 and FIG. 7, when taken out, the display panel 10 is horizontally placed on the plane placing tray 8. The horizontal display panel 10 is taken out through the clamping piece 4 and closely placed on the load-bearing platform 2. Then, the direction of the load-bearing platform 2 is rotated to perform taste inspection. The load-bearing platform 2 is rotated to a vertical direction for conveniently placing the display panel 10 into the oven 9 in the vertical position by the clamping piece 4. The plane placing tray 8 may be a tray.

The conveying apparatus may also be matched with other appliances for use, such as a cart, and is placed into the cart, so that the cart is adapted to provide convenient and effortless assistant movement functions.

In another embodiment of the present application, FIG. 1, FIG. 4, FIG. 5 and FIG. 7, shows the structural schematic diagram of the conveying apparatus of the display panel of an embodiment of the present application. The conveying apparatus includes a fixing bracket 1 and a load-bearing platform 2 adapted to convey the display panel 10, where the fixing bracket 1 and the load-bearing platform 2 are fixedly connected through a rotation axis 3, a clamping piece 4 is disposed on the load-bearing platform 2 and the clamping piece 4 is adapted to clamp and fix the display panel 10. An absorber 41 is used as the clamping piece 4. An absorber 41 is a technology for keeping two objects attached and unseparated through vacuum degree. "Taking" and "placing" in transportation and transfer are realized by changing the vacuum degree of the absorber 41, realizing automation and mechanization through cooperation. When taken out, the display panel 10 is horizontally placed on the plane placing tray 8 through the absorber 41. The horizontally placed display panel 10 is taken out through the absorber 41 and closely placed on the load-bearing platform 2. Then, the direction of the load-bearing platform 2 is rotated to perform taste inspection. The load-bearing platform 2 is rotated to a vertical direction for conveniently releasing the display panel 10 into the oven 9 in the vertical position by the absorber 41. The absorber 41 may use a vacuum absorption manner. For example, a non-electrostatic vacuum slot can be used.

In another embodiment of the present application, FIG. 1, FIG. 4, FIG. 7 and FIG. 8 shows the structural schematic diagram of the conveying apparatus of the display panel of an embodiment of the present application. The conveying apparatus includes a fixing bracket 1 and a load-bearing platform 2 adapted to convey the display panel 10, where the fixing bracket 1 and the load-bearing platform 2 are fixedly connected through a rotation axis 3, a clamping piece 4 is disposed on the load-bearing platform 2 and the clamping piece 4 is adapted to clamp and fix the display panel 10. A hook 42 is used as the clamping piece 4, and the clamping piece 4 is disposed in an edge position of the load-bearing platform 2. The hook 42 grasps objects through specific shapes. The hook 42 is disposed at an edge of the load-bearing platform 2, so as to operate with respect to a size of the display panel 10 without affecting work of taste inspection on the load-bearing platform 2. When taken out, the display panel 10 is horizontally placed on the plane placing tray 8 8 through the hook 42. The horizontal placed display panel 10 is taken out through the hook 42 and closely placed on the load-bearing platform 2. Then, the direction of the load-bearing platform 2 is rotated to perform taste inspection. The load-bearing platform 2 is rotated to a vertical direction for conveniently releasing the display panel 10 into the oven 9 in the vertical position by the hook 42. The load-bearing platform 2 includes a load-bearing surface correspond to the display panel 10. The hook 42 is disposed on the load-bearing surface near an edge, or disposed on a side edge of the load-bearing platform 2. The hooks 42 are optionally disposed in pairs in symmetrical positions, thereby ensuring smoothness and reliability when the hooks 42 are adapted to take and place the display panel 10 without generating a breaking situation.

Figure 8:
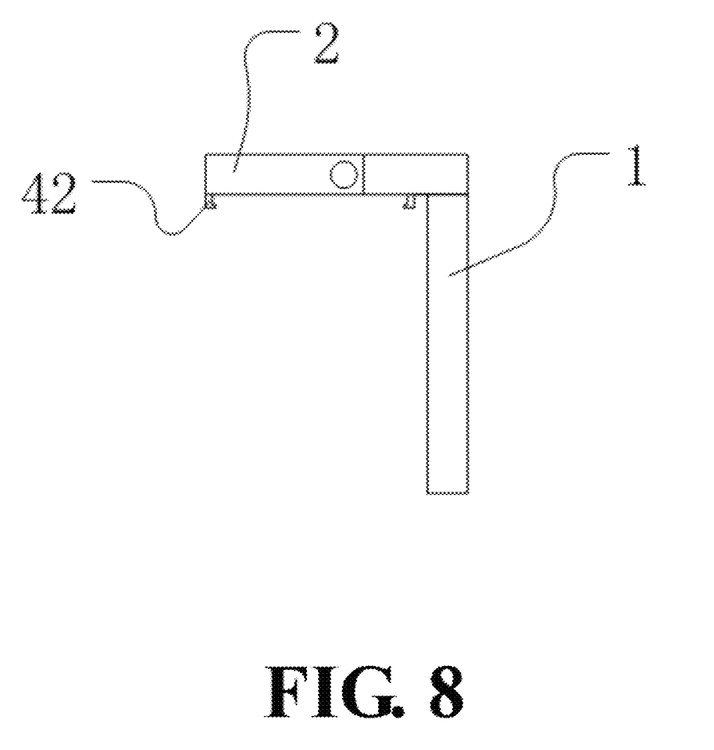
FIG. 8 is a structural schematic diagram of a conveying apparatus of a display panel of an embodiment of the present application.

Specifically, the hook 42 is adjustable. The hook 42 is tightly close to the display panel 10 to clamp and fix the display panel 10 when the hook is in a first state. In taking the display panel 10, the hook 42 hooks the display panel 10 to leave the plane placing tray 8 to further place the display panel 10 in a position close to the load-bearing platform 2. Then, the load-bearing platform 2 is changed from a horizontal direction to an inclined direction for performing taste inspection. In placing the display panel 10, the hook 42 fixes the display panel 10 through a hook portion and leaves the position close to the load-bearing platform 2 in a steady state. Then, the load-bearing platform 2 is changed from the inclined direction to the vertical direction. The hook 42 is separated from the display panel 10 when the hook is in a second state. The hook 2 releases the display panel 10 so that the display panel 10 enters the vertical position of the corresponding oven 9. An accommodating portion of the hook 2 can be disposed in a position close to an edge on the load-bearing surface or in a corresponding position of the side edge of the load-bearing platform 2. The hook can be stored herein after separated from the display panel 10, thereby reducing an occupied space and facilitating transportation and accommodation of the conveying apparatus.

Figure 9:
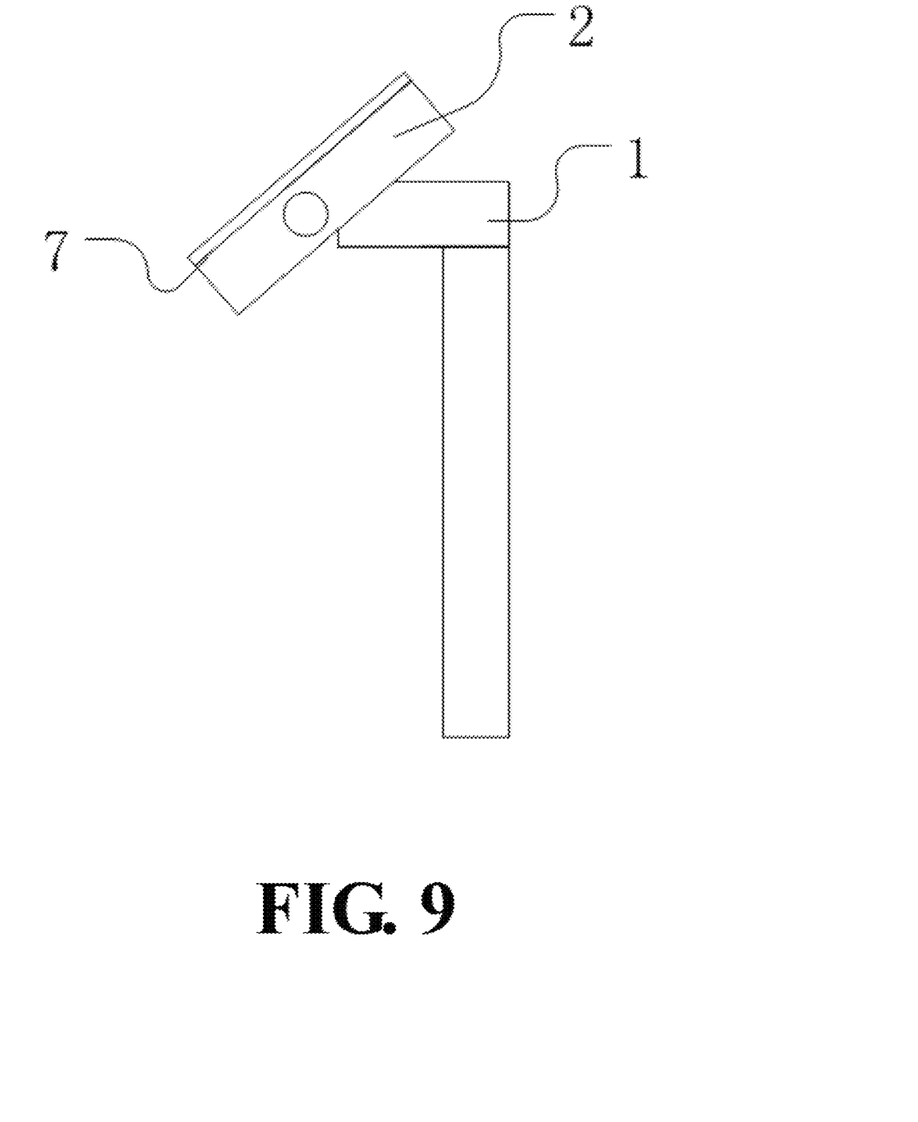
FIG. 9 is a structural schematic diagram of a conveying apparatus of a display panel of an embodiment of the present application.

In another embodiment of the present application, FIG. 1 and FIG. 9 shows the structural schematic diagram of the conveying apparatus of the display panel of an embodiment of the present application. The conveying apparatus includes a fixing bracket 1 and a load-bearing platform 2 adapted to convey the display panel 10, where the fixing bracket 1 and the load-bearing platform 2 are fixedly connected through a rotation axis 3, a clamping piece 4 is disposed on the load-bearing platform 2 and the clamping piece 4 is adapted to clamp and fix the display panel 10. The load-bearing platform 2 includes a load-bearing surface correspond to the display panel 10. A backlight module 7 is disposed on the load-bearing platform 2. The backlight module 7 is disposed on the load-bearing surface. The LCD module (LCM) mode of taste is realized. After the clamping piece 4 obtains the display panel 10 from the plane placing tray 8, the load-bearing platform 2 is changed to the inclined direction for performing taste inspection without increasing a breaking risk caused by changing from the horizontal direction for taking an object through an external object to the inclined direction for placing the object. The backlight module 7 is directly disposed on the load-bearing surface to realize the LCM mode of taste, thereby ensuring more comprehensive and more convenient inspection.

Specifically, the backlight module 7 is detachably disposed on the load-bearing platform 2. The LCM mode of taste and an Open cell mode are switched to realize multiple functions of the load-bearing platform 2 for taste inspection.

In another embodiment of the present application, the conveying apparatus includes a fixing bracket 1 and a load-bearing platform 2 adapted to convey the display panel 10, where the fixing bracket 1 and the load-bearing platform 2 are fixedly connected through a rotation axis 3, a clamping piece 4 is disposed on the load-bearing platform 2 and the clamping piece 4 is adapted to clamp and fix the display panel 10. The conveying apparatus further includes locations for enabling the load-bearing platform 2 to rotate around the rotation axis 3, and the locations are adapted to fix a position when the load-bearing platform 2 rotates around the rotation axis 3 by a preset angle. Whether the display panel 10 is obtained from a plane placing tray 8 in a horizontal direction to perform taste inspection in a certain inclined angle or the display panel 10 is placed into an oven 9 in a vertical direction, the load-bearing platform 2 rotates around the rotation axis 3 to realize directional change. The position is fixed through the locations, ensuring stability and reliability. The locations reduce shake of the load-bearing platform 2 possibly caused by connection with the rotation axis 3 of the fixing bracket 1, and the breaking risk on the display panel 10 caused by the shake is avoid. The locations use a position clamping manner, so that the locations can be disposed in multiple angles and can also be disposed in a specific point according to a known habit.

Specifically, an absorber 41 is used as the clamping piece 4. An absorber 41 is a technology for keeping two objects attached and unseparated through vacuum degree. "Taking" and "placing" in transportation and transfer are realized by changing the vacuum degree of the absorber 41, so as to realize automation and mechanization through cooperation.

Specifically, a hook 42 is used as the clamping piece 4, and the clamping piece 4 is disposed in an edge position of the load-bearing platform 2. The hook 42 grasps objects through specific shapes. The hook 42 is disposed at an edge of the load-bearing platform 2, so as to better operate with respect to a size of the display panel 10 without affecting work of taste inspection on the load-bearing platform 2.

Specifically, the load-bearing platform 2 includes a load-bearing surface correspond to the display panel 10, a backlight module 7 is disposed on the load-bearing platform 2 and the backlight module 7 is disposed on the load-bearing surface. The LCD module (LCM) mode of taste is realized.

In another embodiment of the present application, the conveying apparatus includes a fixing bracket 1 and a load-bearing platform 2 adapted to convey the display panel 10, where the fixing bracket 1 and the load-bearing platform 2 are fixedly connected through a rotation axis 3, a clamping piece 4 is disposed on the load-bearing platform 2 and the clamping piece 4 is adapted to clamp and fix the display panel 10. The fixing bracket 1 is disposed in a retractable mode. The retractable fixing bracket 1 flexibly adapts to operating states of different heights, thereby facilitating taking and placing of the display panel 10 and facilitating taste inspection for the display panel 10 in proper positions. In use, the position for horizontally placing the display panel 10 by the plane placing tray 8, the position for taste inspection for the load-bearing platform 2 and the position for vertically placing the display panel 10 in the oven 9 may be correspondingly different in directions due to the rotation axis 3, and may also be inconsistent in heights, and a position of the conveying apparatus in taking and placing the display panel 10 also needs to avoid unnecessary collision with the plane placing tray 8 and the oven 9. A certain flexible range is set as required with respect to the retractable arrangement of the fixing bracket 1. A mode of combining a vertical column with a sleeve, a mode of moving and fixing in a groove, and other modes can be used.

Specifically, an absorber 41 is used as the clamping piece 4. An absorber 41 is a technology for keeping two objects attached and unseparated through vacuum degree. "Taking" and "placing" in transportation and transfer are realized by changing the vacuum degree of the absorber 41, so as to realize automation and mechanization through cooperation.

Specifically, a hook 42 is used as the clamping piece 4, and the clamping piece 4 is disposed in an edge position of the load-bearing platform 2. The hook 42 grasps objects through specific shapes. The hook 42 is disposed at an edge of the load-bearing platform 2, so as to better operate with respect to a size of the display panel 10 without affecting work of taste inspection on the load-bearing platform 2.

Specifically, the load-bearing platform 2 includes a load-bearing surface correspond to the display panel 10, a backlight module 7 is disposed on the load-bearing platform 2 and the backlight module 7 is disposed on the load-bearing surface. The LCD module (LCM) mode of taste is realized.

Figure 10:
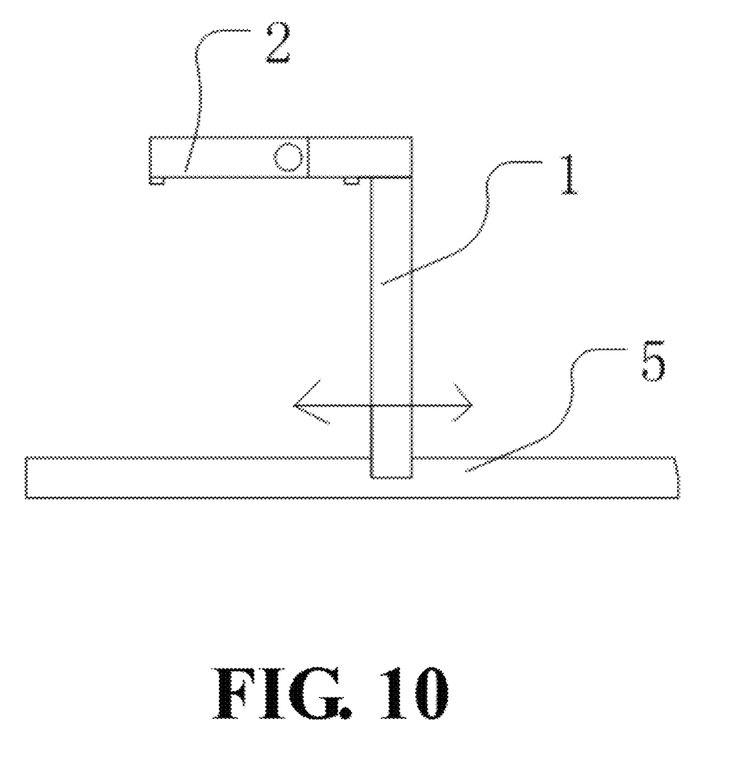
FIG. 10 is a structural schematic diagram of a conveying apparatus of a display panel of an embodiment of the present application.

In another embodiment of the present application, FIG. 1 and FIG. 10 shows the structural schematic diagram of the conveying apparatus of the display panel of an embodiment of the present application. The conveying apparatus includes a fixing bracket 1 and a load-bearing platform 2 adapted to convey the display panel 10, where the fixing bracket 1 and the load-bearing platform 2 are fixedly connected through a rotation axis 3, a clamping piece 4 is disposed on the load-bearing platform 2 and the clamping piece 4 is adapted to clamp and fix the display panel 10. The conveying apparatus further includes at least one sliding chute 5. The fixing bracket 1 is disposed in the sliding chute 5. The fixing bracket 1 and the load-bearing platform 2 move along preset tracks of the sliding chute 5. The conveying apparatus moves via the sliding chute 5, thereby realizing simple operation, force reduction and increase of operating efficiency.

Specifically, an absorber 41 is used as the clamping piece 4. An absorber 41 is a technology for keeping two objects attached and unseparated through vacuum degree. "Taking" and "placing" in transportation and transfer are realized by changing the vacuum degree of the absorber 41, realizing automation and mechanization through cooperation.

Specifically, a hook 42 is used as the clamping piece 4, and the clamping piece 4 is disposed in an edge position of the load-bearing platform 2. The hook 42 grasps objects through specific shapes. The hook 42 is disposed at an edge of the load-bearing platform 2, so as to better operate with respect to a size of the display panel 10 without affecting work of taste inspection on the load-bearing platform 2.

Specifically, the load-bearing platform 2 includes a load-bearing surface correspond to the display panel 10, a backlight module 7 is disposed on the load-bearing platform 2 and the backlight module 7 is disposed on the load-bearing surface. The LCD module (LCM) mode of taste is realized.

Figure 11:
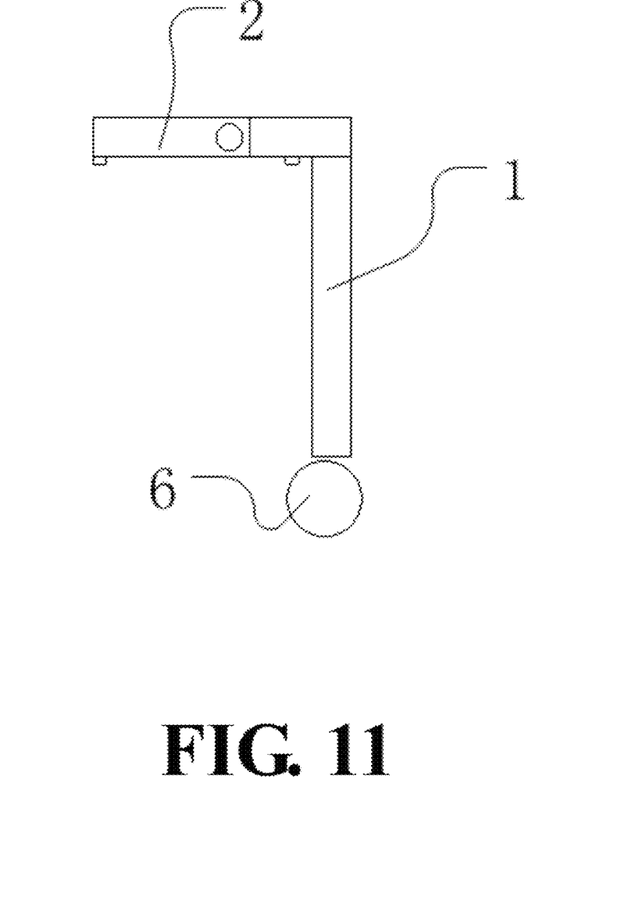
FIG. 11 is a structural schematic diagram of a conveying apparatus of a display panel of an embodiment of the present application.

In another embodiment of the present application, FIG. 1 and FIG. 11 shows the structural schematic diagram of the conveying apparatus of the display panel of an embodiment of the present application. The conveying apparatus includes a fixing bracket 1 and a load-bearing platform 2 for conveying the display panel 10, where the fixing bracket 1 and the load-bearing platform 2 are fixedly connected through a rotation axis 3, a clamping piece 4 is disposed on the load-bearing platform 2 and the clamping piece 4 is adapted to clamp and fix the display panel 10. The fixing bracket 1 is also provided with at least one roller 6, and the fixing bracket 1 and the load-bearing platform 2 move through the roller 6. The roller 6 enables movement ranges of the fixing bracket 1 and the load-bearing platform 2 to be larger and more flexible and enables the conveying apparatus to have better applicability.

Specifically, an absorber 41 is used as the clamping piece 4. An absorber 41 is a technology for keeping two objects attached and unseparated through vacuum degree. "Taking" and "placing" in transportation and transfer are realized by changing the vacuum degree of the absorber 41, realizing automation and mechanization through cooperation.

Specifically, a hook 42 is used as the clamping piece 4, and the clamping piece 4 is disposed in an edge position of the load-bearing platform 2. The hook 42 grasps objects through specific shapes. The hook 42 is disposed at an edge of the load-bearing platform 2, so as to better operate with respect to a size of the display panel 10 without affecting work of taste inspection on the load-bearing platform 2.

Specifically, the load-bearing platform 2 includes a load-bearing surface correspond to the display panel 10, a backlight module 7 is disposed on the load-bearing platform 2 and the backlight module 7 is disposed on the load-bearing surface. The LCD module (LCM) mode of taste is realized.

In another embodiment of the present application, the embodiment discloses a manufacturing system of a display panel, including the transfer device of the display panel described above.

The above contents are further detailed descriptions of the present application in combination with specific optional embodiments. However, the specific implementation of the present application shall not be considered to be only limited to these descriptions. For those of ordinary skill in the art to which the present application belongs, several simple deductions or replacements may be made without departing from the conception of the present application, all of which shall be considered to belong to the protection scope of the present application.

What is claimed is:

1. A conveying apparatus of a display panel, comprising:
   a fixing bracket; and
   a load-bearing platform adapted to convey the display panel;
   wherein the fixing bracket and the load-bearing platform are fixedly connected through a rotation axis; and a clamping piece is disposed on the load-bearing platform and the clamping piece is adapted to clamp and fix the display panel;
   wherein a vacuum absorber is used as the clamping piece;
   wherein the vacuum absorber is adjustable through vacuum degree; the vacuum absorber is tightly close to the display panel to clamp and fix the display panel when the vacuum absorber is in a first state; and the vacuum absorber is separated from the display panel when the vacuum absorber is in a second state;
   wherein the load-bearing platform comprises a load-bearing surface to support and convey the display panel; a backlight module is directly disposed on the load-bearing surface to realize a LCD module mode of taste; and the vacuum absorber is disposed in the load-bearing surface of the load-bearing platform;
   wherein the conveying apparatus further comprises locations for enabling the load-bearing platform to rotate around the rotation axis, and the locations are adapted to fix a position when the load-bearing platform rotates around the rotation axis by a preset angle and the fixing bracket is disposed in a retractable mode; and
   the conveying apparatus further comprises at least one sliding chute; the fixing bracket is disposed in the sliding chute, the fixing bracket and the load-bearing platform move along preset tracks of the sliding chute, the fixing bracket is also provided with at least at least one roller; and the fixing bracket and the load-bearing platform move through the roller.

2. The conveying apparatus of the display panel according to claim 1, wherein the backlight module is detachably disposed on the load-bearing platform; the LCD module mode of taste and an Open cell mode are switched to realize multiple functions of the load-bearing platform for taste inspection.

3. A conveying apparatus of a display panel, comprising:
   a fixing bracket; and
   a load-bearing platform adapted to convey the display panel;
   wherein the fixing bracket and the load-bearing platform are fixedly connected through a rotation axis; and a clamping piece is disposed on the load-bearing platform and the clamping piece is adapted to clamp and fix the display panel; wherein the load-bearing platform comprises a load-bearing surface to support and convey the display panel; a backlight module is directly disposed on the load-bearing surface to realize a LCD module mode of taste; and
   wherein a vacuum absorber is used as the clamping piece, and the vacuum absorber is disposed in the load-bearing surface of the load-bearing platform.

4. The conveying apparatus of the display panel according to claim 3, wherein the clamping piece is disposed in an edge of the load-bearing platform.

5. The conveying apparatus of the display panel according to claim 3, wherein the vacuum absorber is adjustable through vacuum degree; the vacuum absorber is tightly close to the display panel to clamp and fix the display panel when the vacuum absorber is in a first state; and the vacuum absorber is separated from the display panel when the vacuum absorber is in a second states.

6. The conveying apparatus of the display panel according to claim 5, wherein the backlight module is detachably disposed on the load-bearing platform.

7. The conveying apparatus of the display panel according to claim 3, wherein the conveying apparatus further comprises locations for enabling the load-bearing platform to rotate around the rotation axis; and the locations are adapted to fix a position when the load-bearing platform rotates around the rotation axis by a preset angle.

8. The conveying apparatus of the display panel according to claim 3, wherein the fixing bracket is disposed in a retractable mode.

9. The conveying apparatus of the display panel according to claim 3, wherein the conveying apparatus further comprises at least one sliding chute; and the fixing bracket is disposed in the sliding chute; and the fixing bracket and the load-bearing platform move along preset tracks of the sliding chute.

10. The conveying apparatus of the display panel according to claim 3, wherein the fixing bracket is also provided with at least one roller; and the fixing bracket and the load-bearing platform move through the roller.

11. The conveying apparatus of the display panel according to claim 3, wherein the manufacturing system also comprises a plane placing tray, when the display panel is taken out, it is placed horizontally on the plane placing tray.

12. The conveying apparatus of the display panel according to claim 11, wherein the plane placing tray is a tray.

13. The conveying apparatus of the display panel according to claim 3, wherein the manufacturing system also comprises an oven, the display panel is placed into the oven in a vertical position.

14. The conveying apparatus of the display panel according to claim 3, wherein the backlight module is detachably disposed on the load-bearing platform; the LCD module mode of taste and an Open cell mode are switched to realize multiple functions of the load-bearing platform for taste inspection.

15. A manufacturing system of a display panel, comprising a conveying apparatus of the display panel and an oven, wherein the conveying apparatus of the display panel comprises:
    a fixing bracket; and
    a load-bearing platform adapted to convey the display panel;
    wherein the fixing bracket and the load-bearing platform are fixedly connected through a rotation axis; and a clamping piece is disposed on the load-bearing platform and the clamping piece is adapted to clamp and fix the display panel; wherein the load-bearing platform comprises a load-bearing surface to support and convey the display panel; a backlight module is directly disposed on the load-bearing surface to realize a LCD module mode of taste; and
    wherein a vacuum absorber is used as the clamping piece, and the vacuum absorber is disposed in the load-bearing surface of the load-bearing platform; and
    the load-bearing platform is rotated to a vertical direction for placing the display panel into the oven in the vertical position by the clamping piece.

16. The manufacturing system of the display panel according to claim 15, wherein the clamping piece is disposed in an edge of the load-bearing platform.

17. The manufacturing system of the display panel according to claim 15, wherein the vacuum absorber is adjustable through vacuum degree; the vacuum absorber is tightly close to the display panel to clamp and fix the display panel when the vacuum absorber is in a first state; and the vacuum absorber is separated from the display panel when the vacuum absorber is in a second states.

18. The manufacturing system of the display panel according to claim 15, wherein the conveying apparatus further comprises at least one sliding chute, the fixing bracket is disposed in the sliding chute; and the fixing bracket and the load-bearing platform move along preset tracks of the sliding chute; and the fixing bracket is also provided with at least one roller; and the fixing bracket and the load-bearing platform move through the roller.

19. The manufacturing system of the display panel according to claim 15, wherein the backlight module is detachably disposed on the load-bearing platform; the LCD module mode of taste and an Open cell mode are switched to realize multiple functions of the load-bearing platform for taste inspection.

20. The manufacturing system of the display panel according to claim 15, wherein the display panel is taken out through the clamping piece and closely placed on the load-bearing platform; and a direction of the load-bearing platform is rotated to perform taste inspection.

\* \* \* \* \*